United States Patent [19]

Stadler

[11] 4,016,460
[45] Apr. 5, 1977

[54] ELECTRONIC PROTECTION FOR POWER AMPLIFIER

[76] Inventor: Bertold Stadler, 49 Angelhof, 6901 Wilhelmsfeld near Heidelberg, Germany

[22] Filed: Feb. 4, 1975

[21] Appl. No.: 546,871

[52] U.S. Cl. .............................. 330/207 P; 361/88
[51] Int. Cl.² ........................................ H02H 7/20
[58] Field of Search ............ 317/31, 33 R, 33 SC, 317/124; 330/207 P, 59; 307/202 R

[56] References Cited

UNITED STATES PATENTS

| | | | |
|---|---|---|---|
| 3,102,241 | 8/1963 | Johnstone | 330/207 P |
| 3,526,810 | 9/1970 | Williams et al. | 330/207 P X |
| 3,533,003 | 10/1970 | Plaszczynski et al. | 330/207 P |
| 3,555,358 | 1/1971 | Gibbs | 307/202 X |
| 3,579,042 | 5/1971 | Abend | 317/33 R |
| 3,678,291 | 7/1972 | Coe | 330/207 P |
| 3,749,936 | 7/1973 | Bell | 307/202 |
| 3,757,243 | 9/1973 | Kimberly | 330/207 P |
| 3,818,274 | 6/1974 | DeWitte et al. | 317/31 |
| 3,898,532 | 8/1975 | Frank | 317/31 |
| 3,912,980 | 10/1975 | Crump et al. | 317/33 SC X |

*Primary Examiner*—J D Miller
*Assistant Examiner*—Patrick R. Salce
*Attorney, Agent, or Firm*—Scrivener Parker Scrivener & Clarke

[57] ABSTRACT

An overload protection circuit for an amplifier is disclosed in which a signal supply means connected with the input of the amplifier is deactivated when the output of the amplifier exceeds a given value. Transducer means of the optoelectrical type are connected with the output terminals of the amplifier for operating a bistable device such as an operational amplifier to deactivate the signal supply means as long as the overload voltage occurs. Timing capacitor means maintain the signal supply means de-activated for a given period of time after the overload condition is terminated.

6 Claims, 1 Drawing Figure

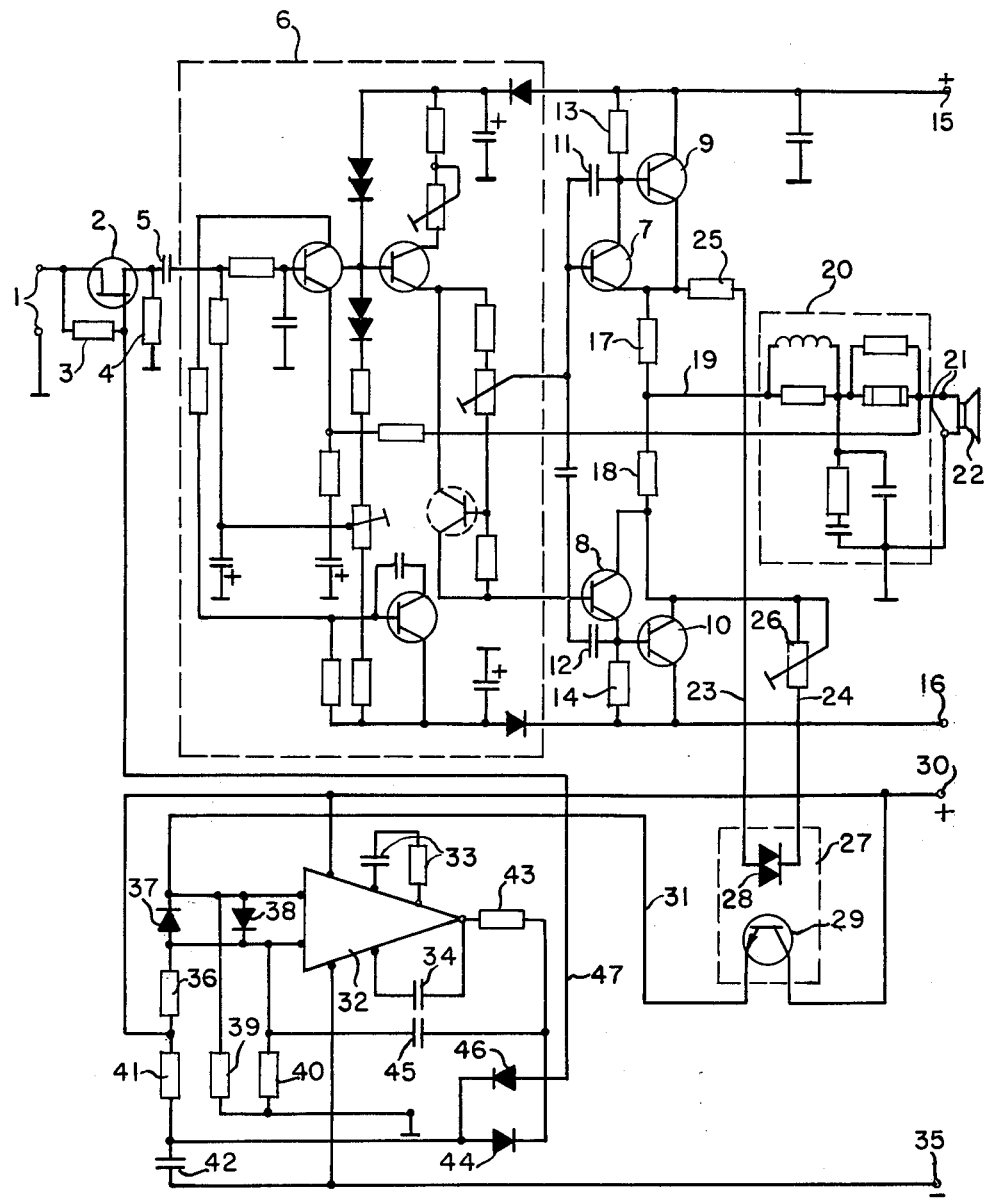

ELECTRONIC PROTECTION FOR POWER AMPLIFIER

BRIEF DESCRIPTION OF THE PRIOR ART

The invention concerns an electronic protection fuse for a power amplifier for music reproduction, especially for stereo. When there is too high of a load on the output transistor, this fuse achieves a reduction of the passing current, measured by a resistor in the circuit.

In the known kind of such electronic fuses for power amplifiers used for high quality music reproduction, a voltage drop in a resistor placed in the circuit of the power transistor is used to control a further transistor which reduces the base voltage of the driving transistors resulting in the reduction of the current in driving and output transistors.

This method results in a strong increase of the distortion factor which strongly disturbs the quality of the music reproduction. In high fidelity music installations a distortion factor far less than 1% is specified. Since contrary to R.M.S. amplification short power peaks may occur in music reproduction which do not yet overload the power transistors thermally, the known electronic fuses lead to a high degree of distortion because of the movement of the working point of characteristic curve of the transistors.

In order to reduce this unwanted increase of distortion, some have used the method of dimensioning the output transistor much higher. This does not only increase the costs, it is also mostly ineffective at a short circuit in the speaker leads. In this case the power transistors get destroyed.

The use of a gauged capacitor to the speaker terminals prohibits itself, because a too small capacitor reduces the frequency response for low frequencies, and a large capacitor causes a too high time-base and, therefore, an unfavorable impulse ratio.

It was also tried to protect the power transistor by quick micro-fuses or voltage-relays. However, micro-fuses are — just as relays mostly too slow to offer satisfactory protection of the power transistor. Moreover, the use of voltage-relays is relatively expensive.

It was also tried to place a current limitation in the power supply of the power amplifier. For this purpose an electronically stabilized power supply is used in a way that the voltage is regulated by a strap transistor. With some further expenditure a current limitation is used at the same time decreasing the voltage at increasing current. To protect a stereo power amplifier, however, two electronically stabilized power supplies are needed, because an overload in one or the other power amplifier can occur. Another doubling of this expenditure is needed for quadrophonic or 4 channel amplifiers where four electronically stabilized power supplies are needed.

Common for all electronic protection circuits of power amplifiers is the disadvantage that through increase displacing of the working point on the characteristic curve of the transistors the distortion increases to a figure which is not acceptable.

SUMMARY OF THE INVENTION

The object of this invention is to obtain an electronic protection circuit which has none or no remarkable influence on the distortion figure, but still allows the complete drainage of the admissible continuous power of the power transistors.

According to a primary object of the invention, this problem is solved in such a way that a bistable element controlled by the flowing current through the power amplifier is shifting quickly after reaching the threshold. The shifting of the bistable element switches off the power transistor during a certain time period. After this period the bistable element shifts back to operating position.

A special advantage of this invention is that there is practically no influence on the distortion. Only during short overload peaks or at a real short circuit are the power transistors blocked. In case of overload peaks the time of blocking is usually so short that it is not even heard. It is to be considered that the power supply is usually made so strong that the power amplifier also reproduces dynamic music peaks for a short time. The bistable element can also be dimensioned not to shift before a certain overload current passes through the power transistors for a certain time whereas the determination of overload current and time period is set in a way that the safe temperature will not be exceeded. A further advantage of this invented electronic protection fuse is that it does not demand a galvanic separation between the speakers and the power transistors through a condenser. In spite of these features the invented protection fuse guarantees, also at a constant short circuit, that the power transistors will not be overloaded, its safe temperature value will not be exceeded.

The obtained signal of the bistable element can be supplied to the power amplifier at several points. For example, this signal can be supplied to the driving transistors or also directly to the power transistors. In preferred circuits of the invention, however, the output of the bistable element is supplied to an input stage of the power amplifier and blocks this when the bistable element is in the tripped condition. This way inside the power amplifier a condition prevails as if no signal would be at the input and in all transistors only the current for set bias flows, for example, the bias at class B-push-pull output amplifier. The bistable element can be constructed in several ways. For example, it can be used as a circuit known as Schmitt-Trigger circuit which promptly switches over at a given input voltage level at the output.

The preferred version of the invention uses an operational amplifier whose one input is connected to a signal interlocked with the current flowing through the power transistors and whose other input is connected to a reference voltage. This type of operational amplifier has a very favorable operating behavior and is inexpensive when produced in large quantities. By adjusting the reference voltage the switching level can be set within a wide range. The bistable element can be galvanically connected to the power transistors. This normally demands a separate power supply of the bistable element to obtain the necessary independence of potential. For a preferred form of the invention an optoelectronic element (optically coupled isolator) is used to obtain a signal corresponding to the flowing current for the bistable element. The optoelectronic element consists of a light-emitting diode which is fed a voltage corresponding to the flowing current through the power transistors and whose light influences a photo transistor. By using a transducer of this kind, which practically consists only of a LED-diode and a transistor, a simple galvanic separation is made possible. Additionally by the selection of a different sensitivity of the LED-diode and the transistor the wanted operation range can be determined. In addition to this a trimmer-resistor is inserted in the circuit to the LED-diode. The trimmer influences the flowing current through the LED-diode and herewith the current level is set through the power transistor at a level which gives a voltage in the output of the optoelectronic transducer which is also equal to the reference voltage of the operational amplifier determining the tripping point.

As soon as the bistable element has tripped, the input transistor is blocked and so the current through the driver and power transistors is reduced to the bias. This way the currency fed to the optoelectronic element is under the value by which the optoelectronic element brings the bistable element to trip. To avoid a too frequent oscillating of the tippling-element it is either constructed in a way that a retripping call for a certain adjustable time or a timing constant is provided which delays the insert of the power amplifier. In the preferred version of the invention for this purpose the tripped bistable element charges a capacitor connected to its output with a diode, and a discharging resistor is connected to the capacitor. The capacitor voltage is connected to the input transistor which blocks a sufficient capacitor voltage. During the time-constant of discharging the power amplifier is also blocked, even when the bistable-element in the meantime has tripped to normal operating position.

As an input transistor of the power amplifier a field effect transistor is preferably used. Preferred is the discharging resistor for the capacitor which determines the time constant, later connected to the input transistor, and between capacitor and input transistor a further diode is incorporated. This version has proved to be most favorable. The gate-connection of the FET-transistor is connected to the diode with a capacitor, and one of the collector-base electrodes is connected to one of the discharging resistors. The other one is connected to the audio input signal so that the collector emitter line placed in the flow of the audio signal is fed to the power amplifier.

BRIEF DESCRIPTION OF THE DRAWING

Further details and advantages of the invention are given in the following description with reference to the single FIGURE of drawing, which is a schematic drawing of the circuit of a high quality music power amplifier with the invented electronic protection (fuse).

DETAILED DESCRIPTION

To one of two input terminals 1, whose other one is grounded, the electrode of a FET transistor 2 is connected, from which a resistor 3 leads to the gate-connection of the FET transistor 2. To the other electrode of the collector emitter circuit of the FET transistor 2 a discharging resistor 4 is connected whose other end is grounded. To this electrode additionally a capacitor 5 is connected whose other end is connected to the amplifier section 6, described by the dotted line block, whose further circuit details are of no interest. This includes usual amplifier stages such as control amplifier, etc. Additionally the amplifier section 6 also includes a symmetrical output circuit and is constructed in a way that at its output two driving transistors 7 and 8 of a push-pull Class B power amplifier can be connected. The driver transistors 7 and 8 feed the supplied music signal into the power transistors 9 and 10. The described class B push-pull power driven amplifier is a npn transistor, the power transistor fed by it is a pnp transistor. On the other side of the circuit the driver transistor 8 is a pnp and the power transistor 10 fed from it is a npn transistor. The bases of both driver transistors are connected at the output of the amplifier section 6. Additionally from each of both bases feedback capacitors 11 and 12 lead to the respective collectors, to which additionally the base of the power transistors 9 and 10 are connected. To each of the collectors of the driver transistor working resistors 13 and 14 are connected. The working resistor 13 of the transistor 7 is connected to the positive pole 15, whilst the working resistor 14 is connected to the negative pole 16 of the power supply. Both emitters of the driver transistors are connected together through serial connection of two emitter resistors 17 and 18. Additionally the collectors of power transistors 9 and 10 are connected to the connection of the associated driver transistors 7 and 8. The emitters of the power transistors 9 and 10 are connected directly with the positive and negative poles 15 and 16, respectively. From the common connection point of both emitter resistors 17 and 18 a connection lead 19 feeds through a connection link 20, for example, a crossover network, to a pair of output terminals 21, at which a loudspeaker 22 is connected. The second of the terminals 21 is grounded.

From the collector of the power transistor 9 a connection 23, and from the power transistor 10 a connection 24 leads to an optoelectronic transducer 27. In the connection leads 23 and 24 one resistor each is inserted, of which at least one is adjustable. The connections 23 and 24 are connected to both electrodes of a LED diode 28. The lighted area of the LED diode 28 is placed opposite a photo transistor 29 whose collector is connected to the positive pole 30 of a voltage supply. From the emitter of the photo transistor 29 lead 31 leads to the non-inverted input of operational amplifier 32. To adjust its operation characteristic the operational amplifier is connected in the known way to a RC circuit 33 and a capacitor 34; additionally the positive pole 30 and the negative pole 35 are connected to the voltage supply. At the inverted input of the operational amplifier 32 a defined reference voltage is connected which is fed through a resistor 36. Between the inverted and the non-inverted input of the operational amplifier two diodes 37 and 38 are connected in inverse-parallel. These avoid in a manner already known the appearance of too large difference voltage between the two inputs. Additionally both inputs are grounded through the resistors 39 and 40. Then another resistor 41 is connected to the positive pole 30 of the voltage supply which is connected to a timing capacitor 42 which again is connected to the negative pole 35 of the voltage supply.

To the output of the operational amplifier 32 an output resistor 43 is connected to which also a diode 44 which its cathode is connected. Between the cathode of the diode 44 and the inverted input of the operation amplifier 32 a capacitor 45 is connected. At the anode of the diode 44 the cathode of the diode 46 is connected whose anode through the control lead 47 is connected to the gate-connection of the FET transistor 2. At the control lead 47 is also the mentioned resistor 3 connected.

During the normal operation of the power amplifier the voltage through the connection 23 and 24 of the LED diode 28 is so low that the LED diode does not emit light, at least not in a sufficient quantity, to make the photo transistor penetrable. However, if in case of a corresponding audio impulse at the input 1 of the power amplifier the current through the power transistor 9 and 10 increases to more than the safe value, then there arises a voltage at the emitter resistors 17 and 18 which, fed to the LED diode 28 through the resistors 25 and 26 and the connections 23 and 24, start to emit light. Hereby the photo transistor becomes conducting. The voltage fed through the lead 31 to the non-inverted input of the operational amplifier 32 increases the reference voltage fed through the resistor 36 at the inverted input of the operational amplifier 32. Thus the operational amplifier 32 shifts and the positive voltage at the output of operational amplifier 32 becomes negative. The previously positive voltage at the output of the operational amplifier 32 was isolated from the gate-connection of the FET transistor 2 by the diodes 44 and 46. The voltage has now changed to negative and is led through the diodes 44 and 46 and the control lead 47 to the gate-connection of the FET transistor 2. This way the collector emitter line of the FET transistor gets highly resistive. No audio signal passes through the condenser 5 to the power amplifier 6 any more, and the amplifier 6 supplies no audio signal to the driving transistors 7 and 8. The current through the driving transistors 7 and 8 and the following power transistors goes down to the bias current. The voltage through the resistors 17 and 18 is reduced and the LED diode 28 emits no light any more, and so the photo transistors closes again. The operational amplifier 32 trips back to its original condition. Before this happens, however, not only the FET transistor 2 closes but the timing capacitor 42 is also charged. Because of this charge the polarity of the diode 44 is not influenced by the tripping of the operational amplifier. The timing capacitor 42 discharges itself on the diode 46 and the control lead 47 through the discharging resistor 4 to ground. As soon as the voltage at the capacitor 42 is sufficiently reduced, the FET transistor 2 becomes conducting again. If in the meantime the voltage peak at input 1 has faded, the amplifier operates as before. If this audio peak still exists or in case of a short circuit in the following section of the output lead 19, then the voltage drop at the resistors 17 and 18 increases again and the optoelectronic transducer 27 responds again. The operational amplifier 42 trips, the FET transistor 2 closes and the timing capacitor 42 charges. This procedure is repeated as long as a too high current is fed through the emitter resistors 17 and 18. In case of a short circuit at the output lead 19 a too high current — limited by the resistors 17 and 18 only — flows through the transistors 9 and 10 for a short time. Because of the quick response of the arrangement within one or some microseconds, the thermal load of the transistors does not leave the safe area. Because of the blocking time caused by the timing capacitor 42 and its defined blocking time, the relationship current - pause is adjusted in a way that the mean power of the power transistors 9 and 10 does not exceed the safe area. If there is a short circuit or an overload at the input of the power amplifier for a very short time, the power transistors will be blocked only once or twice, which is usually not noticeable. The response value of the arrangement can be adjusted in that way that the power amplifier is not affected before the safe area limit of the power transistors 9 and 10 is reached. After exceeding the safe area power this electronic fuse protection will respond in a tripped manner and promptly switches off the power amplifier. It switches it on again after a certain time determined by the selection of the size of the timing capacitor 42 respectively the discharging resistor 4.

It is understood that the invention in question is not limited to the described example, but many modified arrangements are possible within the frame of the invention. For example, the use of the protection circuit of the invention is not limited to be an electronic fuse for music power amplifiers. This arrangement can also be used in connection with other circuits. Also it is not absolutely necessary to use an optoelectronic transducer and an operation amplifier to realize this electronic protection, but this construction especially is very favorable and reliable. Instead of using a special time-element as described the tripping back of the operation amplifier can be time-delayed; for example, the operation amplifier can be operated as a mono-stable monovibrator. Instead of an operational amplifier 32 a mono-stable multivibrator can also be used, which is started by a signal from the photo transistor 29 and trips back after its time constant has passed. During the time in which the mono-stable multivibrator is tripped, the power amplifier is blocked.

What is claimed is:

1. An overload protection circuit for a power amplifier (6) having an input terminal and an output terminal, supply means (2) for supplying an input signal to said amplifier input terminal, a load (22), and means (7–10) for connecting said amplifier output terminal with said load, said overload protection circuit comprising
   a. bistable means (32) operable alternately between a normal first condition and a second condition, said bistable means including a pair of input terminals and an output terminal;
   b. means (36) for supplying a reference voltage to one input terminal of said bistable means;
   c. transducer means (27) for supplying to the other input terminal of said bistable means a control voltage that is a function of the output voltage of said power amplifier, said bistable means being tripped from said first condition to said second condition when said power amplifier output signal exceeds a predetermined value;
   d. means (47) for connecting the output terminal of said bistable means with said input signal supply means, said bistable means being operable in said second condition to temporarily deactivate said input signal supply means and thereby eliminate the overload condition appearing at the output terminal of said power amplifier, whereby said bistable means is tripped back to its first condition; and
   e. timing means (42) for maintaining the input signal supply means (2) in the deactivated condition for a given period of time after the bistable means has been tripped back to it first condition.

2. Apparatus as defined in claim 1, wherein said power amplifier includes a first power source (15, 16) and wherein said bistabale means includes a second power source (30, 35); and further wherein said transducer means comprise optoelectrical transducer means.

3. Apparatus as defined in claim 2, wherein said means for connecting said power amplifier output terminal with said load comprises a symmetrical output stage including a pair of output power transistors (9, 10); wherein said optoelectrical transducer means includes a light emitting diode (27), and resistor means (25, 26) connecting said light emitting diode across the output terminals of said output power transistors.

4. Apparatus as defined in claim 1, wherein said input signal supply means includes a field effect transistor (2) having a pair of gate-controlled electrodes through which the signal is supplied to said amplifier input terminal via a series-connected capacitor (5), and a discharge resistor (4) connected at one end with the junction between said series-connected capacitor and said field effect transistor, the other end of said discharge resistor being connected with ground; and further including first diode means (46) connecting said timing means with the gate circuit of said field effect transistor.

5. Apparatus as defined in claim 4, wherein said timing means comprises a timing capacitor (42); and further including second diode means (44) connecting the output terminal of said bistable means with the junction between said timing capacitor and said first diode means.

6. Apparatus as defined in claim 5, wherein said bistable means comprises an operational amplifier.

* * * * *